United States Patent [19]
Hasebe et al.

[11] Patent Number: 5,458,685
[45] Date of Patent: Oct. 17, 1995

[54] VERTICAL HEAT TREATMENT APPARATUS

[75] Inventors: Kazuhide Hasebe, Yamanashi; Nobuaki Takahashi, Hachioji; Keiji Sukekawa, Zama, all of Japan

[73] Assignees: Tokyo Electron Kabushiki Kaisha, Tokyo; Tokyo Electron Tohoku Kabushiki Kaisha, Esashi, both of Japan

[21] Appl. No.: 104,651

[22] Filed: Aug. 11, 1993

[30] Foreign Application Priority Data

Aug. 12, 1992 [JP] Japan .................................. 4-236346
Aug. 13, 1992 [JP] Japan .................................. 4-236338

[51] Int. Cl.$^6$ .................................................. C23C 16/00
[52] U.S. Cl. ........................... 118/724; 118/715; 118/725
[58] Field of Search ................................... 118/715, 719, 118/724, 725, 728

[56] References Cited

U.S. PATENT DOCUMENTS

| | | | |
|---|---|---|---|
| 4,290,385 | 9/1981 | Nakanisi | 118/730 |
| 4,798,165 | 1/1989 | deBoar | 118/715 |
| 4,825,809 | 5/1989 | Mieno | 118/725 |
| 4,891,335 | 1/1990 | MCNeilly | 437/247 |
| 4,989,540 | 2/1991 | Fuse | 118/719 |
| 5,058,526 | 10/1991 | Matsushita | 118/715 |
| 5,088,922 | 2/1992 | Kakizaki | 432/152 |
| 5,268,034 | 12/1993 | Vukelic | 118/719 |
| 5,279,670 | 1/1994 | Watanabe | 118/725 |
| 5,303,671 | 4/1994 | Kondo | 118/719 |

FOREIGN PATENT DOCUMENTS 61-114522  6/1986  Japan .

OTHER PUBLICATIONS

English language Abstract for Laid-Open Publication No. 61-114522.

*Primary Examiner*—R. Bruce Breneman
*Assistant Examiner*—Jeffrie R. Lund
*Attorney, Agent, or Firm*—Beveridge, DeGrandi, Weilacher & Young

[57] ABSTRACT

The present invention relates to a heat treatment apparatus wherein treatment objects such as semiconductor wafers contained in a treatment boat are loaded in a treatment container such as a process tube. Water vapor is supplied from the top of the treatment container toward the bottom for heat treatment of the treatment objects to permit water vapor passage between the treatment container top and the top face of the heat treatment boat. A gas diffusion plate possessing for example 16 flow holes is provided, moreover, a heat treatment space is formed at the bottom direction of the gas diffusion plate. These flow holes are arranged at equal intervals in the circumference direction of a space between the outer circumference of the treatment objects held by the heat treatment boat and the inner side of the treatment container. As a result of this type of construction, the supplied treatment gas (water vapor) can quickly and completely cover all of a plurality of treatment objects contained horizontally at equal spacing in the vertical direction of the heat treatment apparatus to enable uniform heat treatment.

12 Claims, 7 Drawing Sheets

VERTICAL HEAT TREATMENT APPARATUS

BACKGROUND OF THE INVENTION

The present invention relates to a heat treatment apparatus.

In general heat treatment apparatuses, reactive gas is introduced as the treatment gas into a treatment container for forming a thin film, such as an oxidation or nitrogenation film, on the surfaces of heat treatment objects, such as semiconductor wafers. Among widely used versions of these apparatus are those for performing oxidizing, CVD and diffusion treatment. Recently, the vertical type heat treatment apparatus is gaining favor due to its advantage of easily performing uniform heat treatment of the heat treatment objects.

However, in a conventional vertical heat treatment apparatus, for example, a plurality of heat treatment objects are supported horizontally by a boat and loaded into a heat treatment container and heated to the treatment temperature by a heating furnace. Treatment gas is then supplied to the container and heat treatment is performed for forming an oxidation or other type of thin film on the object surfaces. After film formation, the boat is unloaded from the container, and the objects are removed sequentially from the boat.

However, in view of the continuing trend toward higher integration and microminiaturization of semiconductor integrated circuits, in addition to the need for greater diameter of the treatment objects, the requirement has increased for performing uniform heat treatment in order to obtain unvarying film thickness throughout the treatment object surfaces.

In addition, due to the increasing demand for semiconductor integrated circuits, the need has grown for simultaneously treating a plurality of objects. For these reasons, uniform heating of the heating area in the heat treatment apparatus treatment container and uniform treatment gas density have both become major issues.

Various means for promoting uniform treatment gas density in a heat treatment apparatus have appeared in the past. For example, in Japanese Patent Laid-Open Publication No. 3-47531, a fluid diffusion apparatus comprising a porous structure and a treatment apparatus utilizing this fluid diffusion apparatus, in addition to a treatment apparatus utilizing an injector comprising a porous structure are disclosed. In these apparatuses, reaction gas is supplied to the porous fluid diffusion device or injector so as to uniformly emit reaction gas from microscopic holes of the porous structure into the treatment area.

Also, in Japanese Utility Model Laid-Open Publication No. 58-191635, a vertical chemical vapor deposition apparatus is disclosed wherein a gas insertion nozzle from a gas mixing vessel is divided among a plurality of holes, and the test material (treatment object) can be freely loaded and unloaded with respect to the supporting stand at a variable horizontal position. In this vertical chemical vapor deposition apparatus, the gas mixing vessel is installed at the upper direction of the supporting stand at a suitable position for gas mixing. The gas supplied from the nozzle is mixed at the upper part of the gas mixing vessel, and the mixed gas is uniformly emitted from a plurality of holes in the gas mixing vessel to the test material on the supporting stand.

However, in the above mentioned treatment apparatus of 3-47531, although the reactive gas can be uniformly emitted from the upper direction of the heat treatment objects supported in the heat treatment boat, since microscopic pores formed in the porous structure are used for gas emission holes, the reactive gas supply speed is slow. Particularly when the treatment objects are to be treated for a short time interval, as in the case of forming a gate oxidation thin film, at the gas supply rate from this type of porous structure, uniform coverage of the entire heating area by the treatment gas is difficult in a short time. Consequently, heat treatment is difficult to perform in a short time and at uniform gas density, and for this reason, the problem is encountered where variations in heat treatment arise according to the treatment object supporting position.

Also, in the case of heat treatment using the above mentioned injector, in addition to the above mentioned problem, heat of the uniform heating area is absorbed by the reactive gas in the injector. The temperature declines in proximity of the injector to disrupt the temperature distribution of the uniform heating area, thus leading to variations in film formation within the same treatment object.

In the vertical chemical vapor deposition apparatus of 58-191635, treatment gas can be supplied uniformly by the gas mixing vessel to the upper surface of the test material on the supporting stand. However, since nearly all the gas is emitted-toward the upper surface of the treatment object, when this gas mixing vessel is used for a heat treatment apparatus wherein a plurality of treatment objects are supported simultaneously over many steps in the vertical direction, nearly all of the emitted gas flow meets resistance from the treatment objects arranged at the upper end and time is required for the gas to uniformly reach the lower treatment objects. Consequently, there is a likelihood of inability to uniformly heat treat the objects in a short time.

SUMMARY OF THE INVENTION

The objective of the present invention is to resolve the above mentioned problem points by providing a heat treatment apparatus wherein a plurality of treatment objects are contained in the vertical direction in a treatment container, treatment gas is exchanged in a short time, all the treatment objects are quickly and completely covered by the treatment gas in a short time, and are thereafter uniformly heat treated.

In a heat treatment apparatus in accordance with this invention, the treatment objects are loaded and supported by a supporting means in the heat treatment container, treatment gas is introduced from the top of treatment container toward the bottom, a gas diffusion plate possessing a plurality of flow holes is provided whereby the treatment gas flows between the treatment container top and supporting means upper end, a heat treatment section located at the bottom, and a supporting means mainly comprising a plurality of flow holes located between the treatment object outer circumferences and treatment container inner face space section and uniformly arranged in the circumference direction.

Also provided in accordance with the invention are an inner tube and outer tube closed at the top of the treatment container and mutually separated by a space. This space is sealed by the bottoms of these tubes and a gas supply means supplies treatment gas at the bottom end of the space. A gas introducing means introduces treatment gas from a gas supply section at the top of the inner tube to the heat treatment section. By this construction, during the time interval until the treatment gas from the gas supply means reaches the gas introducing means, the treatment gas is heated.

As a result of the heat treatment apparatus in accordance with this invention, the holding means supporting the treatment objects is inserted in the treatment container and treatment gas is supplied from the top of this treatment container toward the heat treatment section. This treatment gas is uniformly emitted from the plurality of flow holes formed in the gas diffusion plate into the treatment container in the circumference direction between the treatment object outer circumferences and the treatment container inner face, and quickly proceeds toward the treatment container bottom end without obstruction. Consequently, the gas density in the heat treatment section is quickly made uniform, all loaded treatment objects are heat treated in a short time, and a uniform film can be formed on each treatment object.

Also as a result of the heat treatment apparatus in accordance with the invention, the holding means supporting the treatment objects is inserted into the treatment container and treatment gas is introduced from the outer tube bottom end gas supply section. This treatment gas quickly covers the entire space between the treatment container outer tube and inner tube, and rises upward in this space. In this period, the treatment gas is gradually heated and reaches the heat treatment temperature, whereupon the gas is introduced at the top of the treatment container inner tube. Consequently, disturbance of the temperature distribution in the heat treatment section can be prevented.

DETAILED DESCRIPTION OF THE PREFERRED EMBODIMENTS

First Embodiment

Following is a description of a heat treatment apparatus in accordance with a first embodiment of the present invention with reference to FIGS. 1–4.

Figure 1:
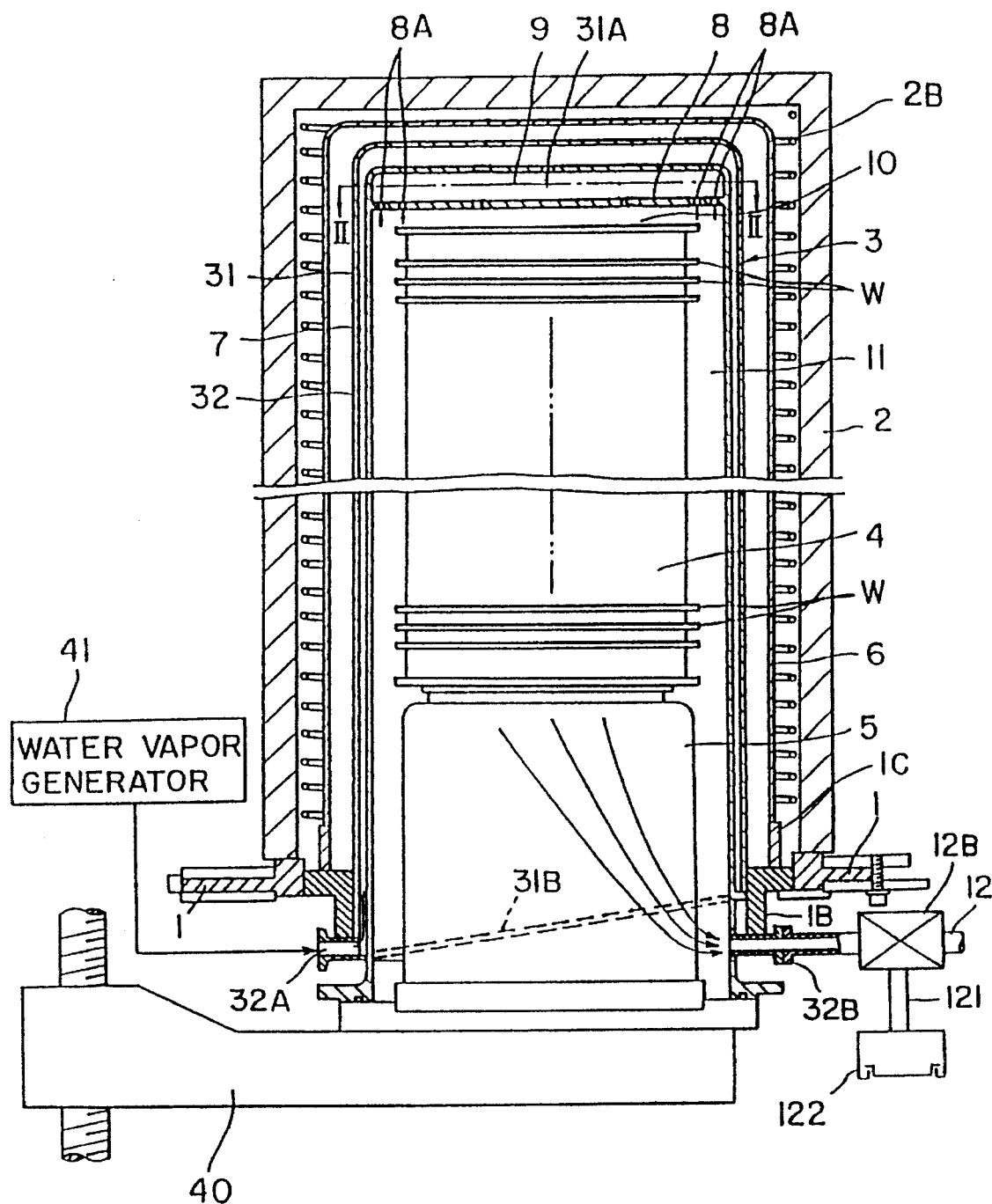
FIG. 1 is a vertical cross sectional view of a heat treatment portion of a heat treatment apparatus in accordance with a first embodiment of the present invention.

As shown in FIG. 1, a heat treatment apparatus in accordance with the first embodiment comprises a tubular shaped heating furnace 2 arranged perpendicularly on a frame 1 with its upper end closed, a treatment container (uniform heating tube) 3 inside and arranged with its central axis aligned with that of the heating furnace 2 formed of quartz or other heat and corrosion resistant material with its top closed and an opening at the bottom, and a supporting means, for example a heat treatment boat (wafer boat) 4 capable of insertion and removal with respect to the treatment container 3 and horizontally supporting a plurality of treatment objects, for example semiconductor wafers W comprised of silicon.

The heat treatment boat 4 supporting a plurality of semiconductor wafers W is inserted into the treatment container 3 by a raising and lowering mechanism 40.

In an oxidation treatment apparatus, for example, a coil 2B of the heating furnace 2 heats the semiconductor wafers W to the temperature of 900 degrees C., treatment gas, for example, steam is supplied, and the internal gas is replaced by the steam, and creates a steam atmosphere state, on the semiconductor wafer W surfaces, silicon oxide film is formed therein.

The heat treatment boat 4 is formed of quartz or other heat and corrosion resistant material and constructed so as to enable it to support 100–150 semiconductor wafers W at equal spacing in the horizontal direction. This is secured in a temperature holding tube 5 formed from the same type of material. The temperature holding tube 5 isolates the treatment container 3 interior from the exterior, and the treatment container 3 interior is maintained at a predetermined temperature.

Also, a container 6 is provided between the heating furnace 2 and the treatment container 3, completely enclosing the treatment container 3 and comprising a ceramic such as silicon carbide on a heat insulating block 1B comprised of silica and interspaced by a silicon ring 1C. Via this container 6, heat from the heating furnace 2 uniformly reaches the entire outer circumference of the treatment container 3 and the internal temperature distribution is made uniform.

The top of the treatment container 3 is closed and at the top a gas introducing means, such as a gas introducing hole 31A, is formed in the inner tube 31. The outer tube 32 also has a closed top and is formed concentrically with respect to the inner tube 31 from which it is separated by a space 7. The bottom end portion 31B of the inner tube 31 is unitized with the outer tube 32 so as to seal space 7.

Also, at the bottom end of this outer tube 32, a gas supply means, such as a gas supply nozzle 32A, is provided for supplying water vapor from a water vapor generator 41. The water vapor is supplied from this nozzle 32A into the space 7 between the inner tube 31 and outer tube 32. While diffusing throughout the circumference, the water vapor rises to the top, from where it is supplied to the interior of the inner tube 31 via a gas introducing hole 31A provided at this top.

As the water vapor diffuses and rises in the space 7, it is gradually heated by the heating furnace 2 enclosing the circumference and when supplied from the gas introducing hole 31A to the inner tube 31 interior, the water vapor has been already heated to nearly the predetermined heat treatment temperature. Also, exhaust nozzle 32B is formed at the bottom end of the outer tube 32, i.e., in the bottom direction of the space 7. The gas used for heat treatment is exhausted to the exterior of the heat treatment apparatus from this exhaust nozzle 32B.

In addition, at the top of the inner tube 31 (functioning as a baffle plate), slightly downward at the inner side, as shown in FIG. 1, a gas diffusion plate 8 having a plurality of flow holes 8A is provided, in unitized form with the inner tube 31 and made of the same material (quartz), between the gas introducing hole 31A (e.g., 29 mm diameter) and heat treatment boat 4 upper end face for supplying water vapor. By this gas diffusion plate 8, the interior of the inner tube 31 is formed into a gas charging space 9 and at the bottom portion of the gas diffusion plate 8, a heat treatment space 10 is provided.

Figure 2:
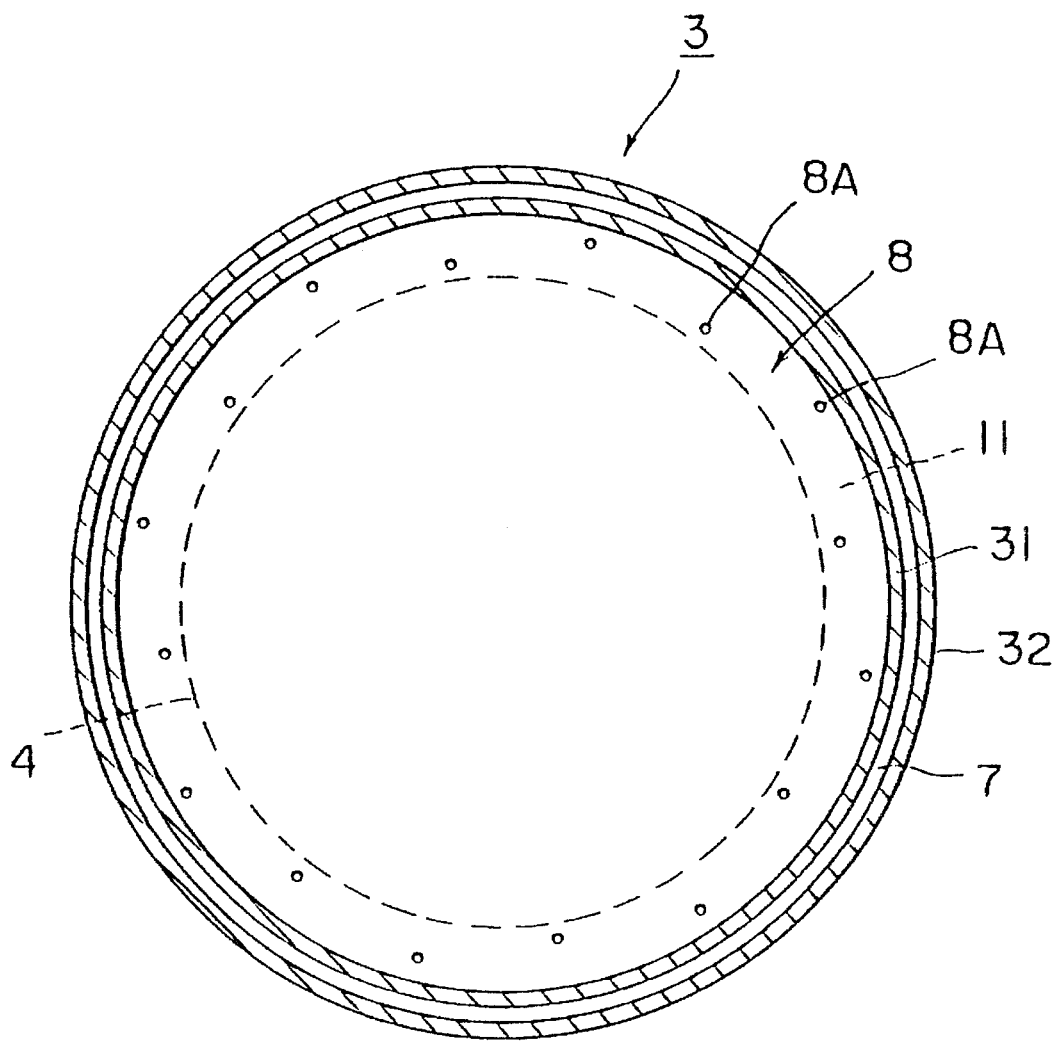
FIG. 2 is a cross sectional view of the gas diffusion plate taken along perspective II—II of the heat treatment apparatus shown in FIG. 1.

The plurality of flow holes 8A are arranged, as shown in FIG. 2 (gas diffusion plate 8 plane view), evenly in the circumference direction mainly in space 11 between the semiconductor wafers W supported by the heat treatment boat 4 and the inner face of the tube 31. Water vapor is mainly supplied to the space 11 from the flow holes 8A of the gas diffusion plate 8 and introduced to the gas charging space 9.

In practice, as shown in FIG. 2, fewer than the conventional number of flow holes 8A (for example, 16 flow holes) may be provided in the diffusion plate 8. However, the flow holes 8A have a larger emission speed than conventional flow holes. These flow holes are arranged in two different sets with respect to the space 11 diameter direction, as illustrated in FIG. 2. One set of eight flow holes 8A is provided around the circumference at a first inner diameter, and a second set of eight flow holes 8A is provided around the circumference at a second outer diameter, for a total of sixteen flow holes 8A. In other words, the 16 flow holes 8A are positioned in the space 11. In this arrangement, most of the water vapor is emitted in the space 11 at the upper end of the heat treatment boat 4. Emission in the 60% to 90% range is desirable for emitting into the space 11. If the range is less than 60%, film uniformity is poor for the wafers at the bottom portion of the boat. Conversely, if it is greater than 90%, the film uniformity is poor for the wafers at the top portion of the boat.

Also, the total area of the flow holes 8A is made smaller than the cross section area of the gas introducing hole 31A. The amount of water vapor per unit of time introduced from this gas introducing hole 31A is larger than the amount per unit of time emitted from the flow holes 8A of the gas diffusion plate 8, forming a slight pressurization in the gas charging space 9 so as to speed the water vapor emission from the flow holes 8A to the treatment space 10.

In the heat treatment apparatus of this invention, the gas diffusion plate 8 (i.e., mesh plate) is provided at the top of the inner tube 31. The flow holes 8A (mesh) are formed in this gas diffusion plate 8 toward the outer side. In addition, the quantity of flow holes 8A (e.g., 3 mm diameter, in the range of 1 to 5 mm diameter), i.e., mesh quantity, is reduced for example from 92 to 30 (in the case of 8 inch wafers). Consequently, when water vapor passes this gas diffusion plate 8, the conductance is reduced to increase a gas pressure in the gas charging space 9, then water vapor emits into the treatment space 10 and the gas (water vapor) flow becomes uniform.

As a result, disturbance from gas striking the top plate of the heat treatment boat 4 is reduced. Also, locating the mesh toward the the outer side reduces the pressure difference due to flow hole position.

Particularly, the following parameters are sought for the water vapor gas emission speed from the flow holes 8A toward the heat treatment space 10. The gas diffusion plate 8 contains 30 (range of 10 to 40) 3 mm diameter flow holes 8A. At an optimum gas flow volume of 10 liters per minute (range of 8 to 20 l/minute), the emission speed is calculated as follows. At an overall opening area of 30 of 3 mm diameter flow holes 8 as $3.14 \times 1.5$ mm$\times 1.5$ mm$\times 30 = 2.1$ cm$^2$, by dividing 10 l/minute by this total opening area (2.1 cm$^2$), a gas emission speed of 50 m/minute can be derived. If the diameter of the flow hole 8A is reduced to 1 mm, the speed is 450 m/minute. If the diameter of the flow hole 8A is less than 1 mm, uniform gas flow from each of the flow hole 8A becomes impossible due to non-uniformity of the diameter of the flow hole 8A when they were formed. A flow hole 8A having diameter of 5 mm results in 17 m/minute speed. If the diameter is more than 5 mm, the gas emission speed becomes less than 17 m/minute. As a result, enough gas speed for uniform treatment on the wafer can not be obtained. Thus, it becomes clear that the gas emission speed increases as the diameter of the flow hole 8A is reduced. Desirable gas emission speed is the range from 17 m/minute to 450 m/minute.

After use for heat treatment, the treatment gas in the heat treatment space 10, as indicated by the slanted lines in FIG. 1, flows in a slanted manner near the temperature holding tube 5 and from the exhaust nozzle 32B via an exhaust conduit 12 and is exhausted by an exhaust fan installed in the factory to the heat treatment apparatus exterior. The factory exhaust system is at the pressure of $-50$ to 100 mm H$_2$O.

When the slanted flow becomes too large near the temperature holding tube 5, uniform heat treatment on the wafers W housed in the bottom portion of the heat treatment boat 4 cannot be carried out. The slanted flow varies in accordance with the gas emission speed and the exhaust pressure of the exhaust conduit 12. In a case where the gas emission speed is more than 17 m/minute, uniformity of the heat treatment to every wafers is good even if the exhaust pressure is the range of $-50$ to $-100$ mmH$_2$O.

The following is a description of the operation of this embodiment.

The raising and lowering mechanism 40 raises and inserts the heat treatment boat 4 into the treatment container 3 to load the semiconductor wafers W into the treatment container 3. Water vapor is then supplied as the treatment gas from the gas supply nozzle 32A into the treatment container 3. The water vapor flows to the space 7 between the inner tube 31 and outer tube 32 of the treatment container 3, and while diffusing in the annular shaped space 7, rises and reaches the inner tube 31 top. In the period before reaching the top, the water vapor is gradually heated by the heating furnace 2, and at the point the water vapor reaches the top, it is already heated to nearly the same temperature as the treatment temperature. The water vapor at treatment temperature flows from the gas introducing hole 31A at the top of the inner tube 31 to the gas charging space 9, then from the flow holes 8A of the gas diffusion plate 8 to the heat treatment space 10.

At this time, 80% of the water vapor is emitted evenly in the annular shaped space 11 formed between the semiconductor wafer W outer circumference and inner tube 31 inner circumference face. Upon reaching the bottom end of the space 11, the water vapor extends over the surfaces of the semiconductor wafers W supported at equal spacing in the treatment boat 4 and the water vapor in the heat treatment space 10 is quickly brought to uniform density.

The remaining 20% of the water vapor is emitted toward the upper end of the heat treatment boat 4 and flows turbulently. The flow is divided from this upper end toward the circumference and continues downward as a regular flow in the space over the heat treatment boat 4, wherein the water vapor density is made uniform.

As a result, the water vapor density quickly reaches uniformity in the whole area of the heat treatment space 10.

In addition, the water vapor brings the heat treatment space 10 to uniformity without disturbance and all the semiconductor wafers W are heat treated in a short time without irregularity to produce a uniform silicon oxide film on each semiconductor wafer W.

The after treatment gas flows as exhaust gas through the exhaust conduit 12 to the exterior factory exhaust system.

As described above, in accordance with this first embodiment, water vapor is emitted uniformly in the annular shaped space 11 between the outer circumferences of the semiconductor wafer W and the inner circumference of the inner tube 31 in the circumference direction, and quickly reaches the bottom of the space 11. For this reason, water vapor is supplied in a short time in the heat treatment space 10 loaded with a plurality of semiconductor wafers W at equal spacing in the vertical direction and quickly covers all the semiconductor wafers W. Therefore, all the semiconductor wafers W are uniformly heat treated and an even silicon oxide film can be formed on each semiconductor wafer W.

Also, when introducing water vapor into the heat treatment space 10 of the treatment container 3, since the water vapor is heated beforehand to nearly the heat treatment temperature in the space 7 between the inner tube 31 and outer tube 32, the temperature within the heat treatment space 10 can be held at essentially the heat treatment temperature and more uniform heat treatment can be performed.

Figure 3:
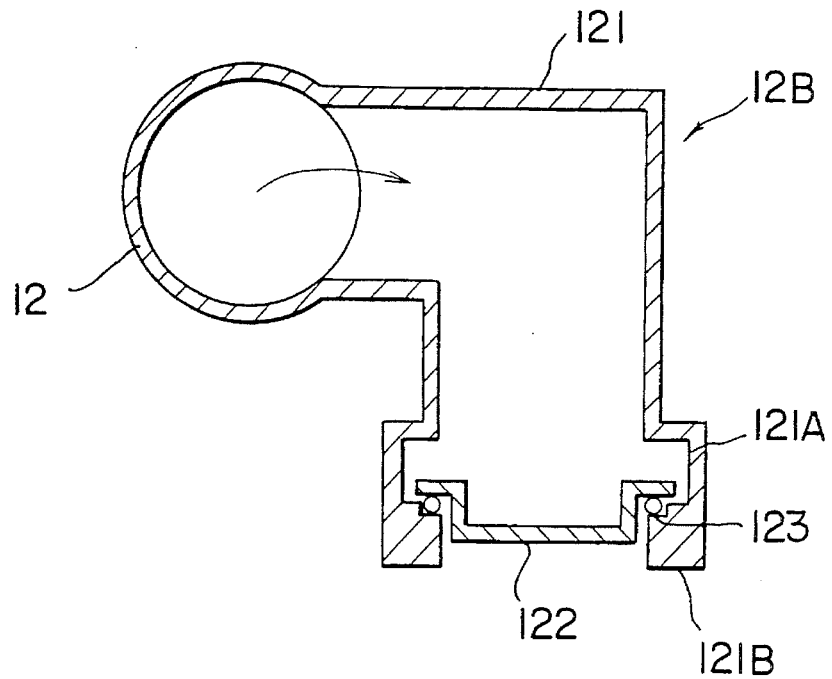
FIG. 3 shows the main portion of one embodiment of the exhaust gas pressure adjustment device of the heat treatment apparatus shown in FIG. 1.

In order to further improve uniformity of heat treatment by the heat treatment apparatus, it is desirable to provide a device which maintains constant exhaust pressure of the exhaust conduit 12. An exhaust gas adjustment device 12B (as also shown in FIG. 3) as a first exhaust gas adjustment device is arranged in this exhaust conduit 12, and by this exhaust gas adjustment device 12B, the exhaust gas is continuously adjusted to a predetermined pressure. The exhaust conduit 12, as indicated in FIG. 3, has a branching tube 121 in the upper exhaust flow. In addition, at the opening end of this branching tube 121, an enlarged diameter portion 121A is formed. In this enlarged diameter portion 121A, a movable valve 122 is arranged so as to enable shifting in the axial direction of the enlarged diameter portion 121A. In other words, this movable valve 122, by its own weight resists external atmosphere pressure. A flange portion 121B extending from the inner circumference face of the expanded diameter portion 121A is pressed via an O-ring or similar means comprising resilient material, and the pressure in the exhaust conduit normally varying between −10 to −100 mmH$_2$O is held by the exhaust gas adjustment device 12B to a reduced pressure of, for example, −1 to −5 mmH$_2$O.

Figure 4:
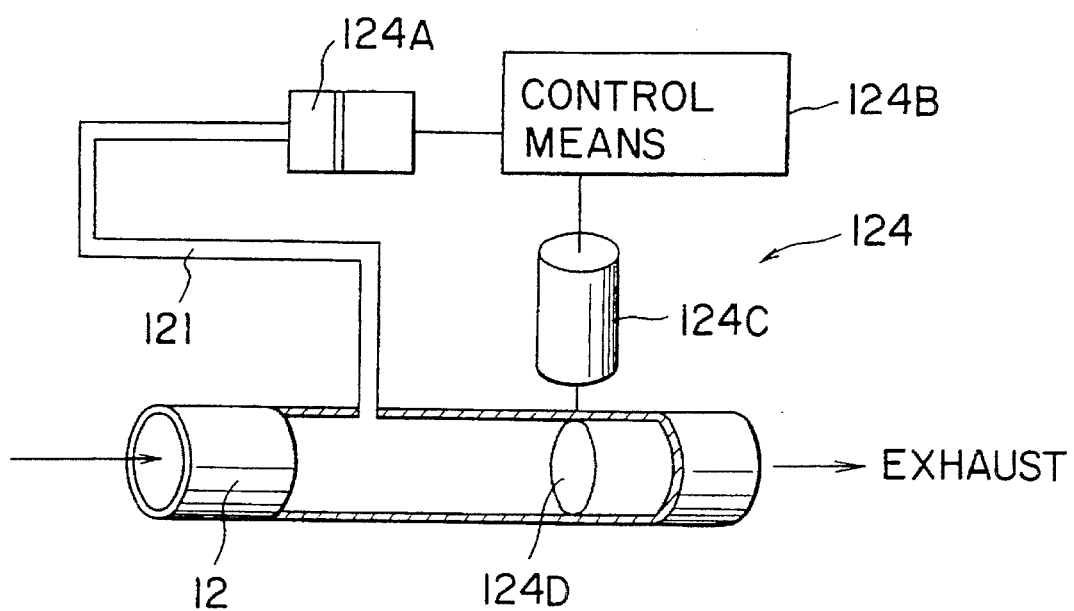
FIG. 4 shows another embodiment of the exhaust gas pressure adjustment device.

Also, in place of the movable valve 122 indicated in FIG. 3, an automatic pressure adjusting device as a second exhaust gas adjustment device indicated in FIG. 4 can be installed in the exhaust conduit 12 upper flow as the exhaust gas pressure adjusting device. This automatic pressure adjusting device 124, as indicated in FIG. 4, comprises a pressure sensor 124A for detecting the input exhaust gas pressure from the branching tube 121 of the exhaust conduit 12, a control portion 124B for producing a control signal output based on the pressure detected by the pressure sensor 124A, a motor 124C driven in accordance with the control signal from the control portion 124B, and a valve 124D such as a butterfly valve operated by the motor 124C for adjusting the exhaust gas flow amount at the exhaust conduit 121 lower flow side. By this arrangement, the pressure detected by the pressure sensor 124A is controlled for a continuous fixed value reduced pressure state of, for example, −1 to −5 mmH$_2$O. The pressure sensor 124A is formed into two chambers left and right, for example, by a diaphragm in the container. The right chamber, for example, is opened to atmospheric pressure, and with this atmospheric pressure as reference, the internal pressure of the exhaust conduit 121 is controlled for the above-mentioned reduced pressure state.

By using these exhaust gas adjustment devices, the exhaust gas pressure is controlled for a continuous reduced pressure state of −1 to −5 mmH$_2$O by the movable valve 122 indicated in FIG. 3 or the automatic pressure adjusting device indicated in FIG. 4. By controlling for fixed exhaust gas pressure from the treatment container 3 in this manner, disturbance of the water vapor flow in the treatment container 3 is avoided and more uniform oxidation treatment of the semiconductor wafers W can be performed.

In the above embodiment, the description referred to the case where the water vapor is supplied to the space between the inner tube 31 and outer tube 32, but the same operating results as the above embodiment can also be expected from a heat treatment apparatus wherein the water vapor is supplied directly from the gas introducing hole 31A of the inner tube 31. Also, in the above embodiment, a double construction for the heat treatment container 3 was described, but the same operating results as the above embodiment can also be expected even without double construction of the heat treatment container 3.

The following are experimental data of uniformity when WET oxidation film is formed on the wafers at the temperature of 900 degrees C.

Oxygen at 19 l/minute and hydrogen at 19 l/minute are burned to produce water vapor, and film formation treatment at 900 degrees C for 7 minutes 15 seconds produces an approximately 180 Angstrom oxidation film. At this time, 120 wafers are contained in the heat treatment boat, of which the 10 wafers each at the top and bottom are dummies and treatment is applied to the central 100 wafers.

Among the top, center and bottom positioned of these 100 wafers, the worst uniformity was plus or minus 1.67%. By combined use of the FIG. 3 and FIG. 4 exhaust gas pressure adjusting devices, this uniformity was improved to within plus or minus 1.3%.

As comparison data, under the same treatment conditions mentioned above, in the case of using a gas diffusion plate having 92 holes, 3 mm in diameter, with the hole positions arranged uniformly in the gas diffusion plate, the uniformity was plus or minus 2.13%. In the above manner, the uniformity improvement degree of the apparatus of this embodiment is effective for the manufacture of microminiaturized semiconductor wafers.

Also, in the above first embodiment, only the case of an oxidation apparatus was described, but this invention can also be applied to CVD and diffusion apparatuses in the same manner. Also, this invention can be applied to a plurality arrangement of heat treatment apparatus.

In other words, this invention is not limited by the example given for the first embodiment. For example, the scope of this invention encompasses a heat treatment apparatus comprising a gas diffusion plate having a plurality of flow holes for transmitting the treatment gas between the treatment container top and holding means upper end, and at the bottom direction composing a heat treatment portion, with the above mentioned plurality of flow holes equally arranged in the circumference direction between the outer circumference of the treatment objects held by a holding means and the treatment container inner face.

Second Embodiment

The following is a description of a second embodiment of this invention with reference to the attached drawings. The second embodiment is an example of using this invention for a vacuum CVD apparatus. A side view cross section of the apparatus is shown in FIG. 5.

Figure 5:
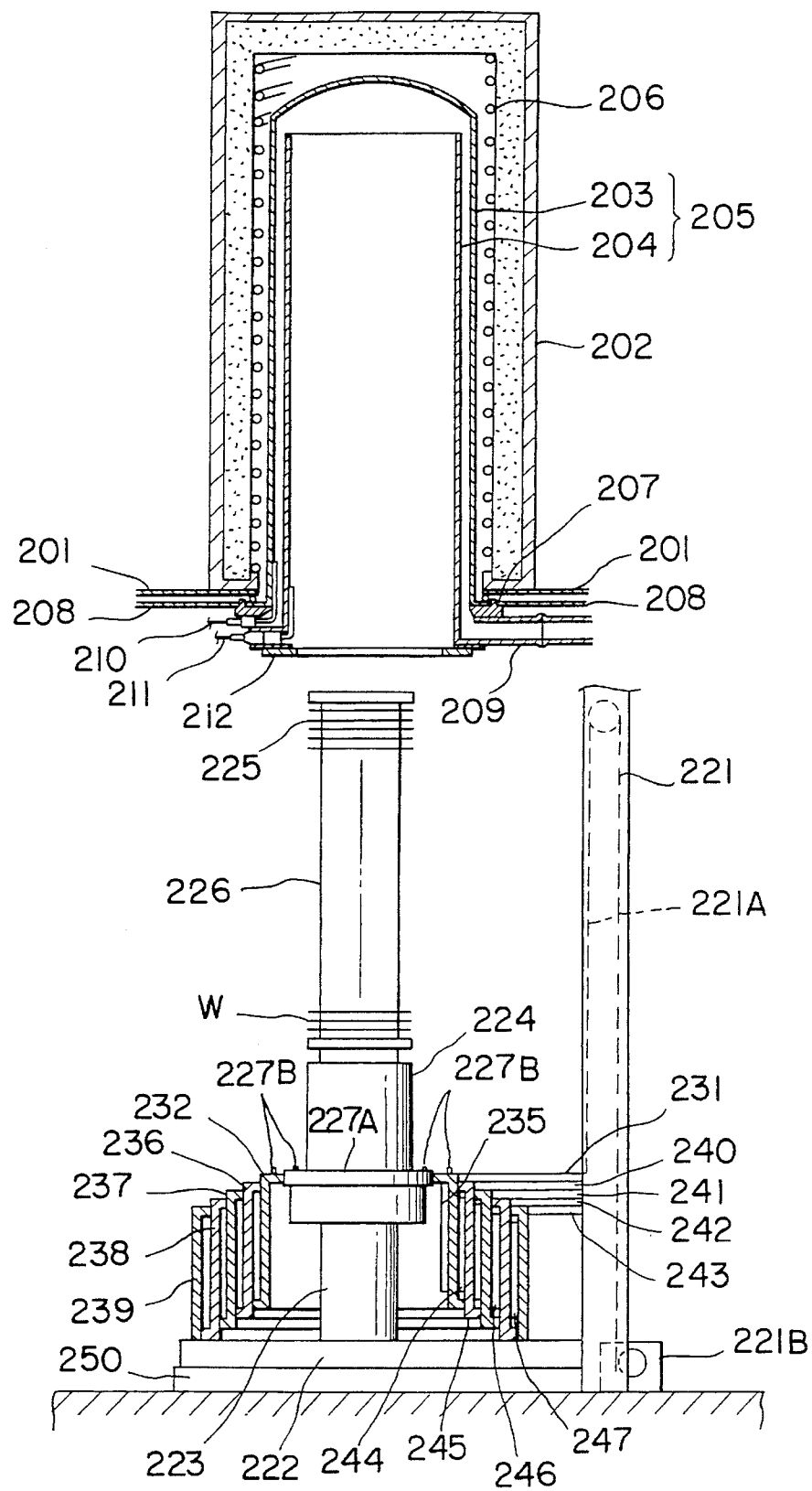
FIG. 5 is an overall vertical cross section diagram of a second embodiment of a heat treatment apparatus in accordance with the present invention as a vacuum CVD apparatus in the state with all covers completely compressed at the bottom direction.

As shown in FIG. 5, at the inner side of a heating furnace 202 supported vertically by base stand 201 and secured horizontally with respect to the floor, a process tube 205 comprising an outer tube 203 of quartz material and an inner tube 204 of quartz material with only the bottom end opened is inserted. Between the inner circumference wall of the heating furnace 202 and the outer tube 203, a heater 206 comprising, for example, a resistance heat generating means, is arranged in a spiral shape. By this heater 206, the interior of the process tube 205 is heated to a predetermined temperature.

Outer tube 202 and inner tube 203 are supported by a manifold 207 via an O-ring or similar sealer, while the manifold itself is supported by a base 208. In this manifold 207, an exhaust means such as a vacuum pump from an exhaust tube 209 for producing a vacuum in the process tube 205, a purge gas introducing tube 210 in a gap between the outer tube 202 and inner tube 203 for supplying purge gas to the interior of the process tube 205, and a process gas introducing tube 211 for supplying reaction gas to the inner space of the inner tube 203 are respectively provided. Also, a stainless steel furnace opening flange 212 is secured at the circumference edge of the manifold 207 bottom face opening and comprises the furnace opening.

At the lower area of the heating furnace 202, a raising and lowering device 221 (elevator) is provided on a base stand 250. A supporting means 223 is provided at the upper part of a movable holding means 222 which is moved up and down by this raising and lowering device 221. In addition, a temperature holding tube 224 is provided at the upper face of the supporting means 223. At the upper face of this temperature holding tube 224, a freely loaded and removed heat treatment boat 226 holding a plurality (100) of heat treatment objects such as semiconductor wafers W horizontally at equal spacing in the vertical direction is provided. At the base circumference of the temperature holding tube 224 at the upper face of the supporting means 223, a flange 212 tightly secured to the furnace opening for tightly sealing the interior of the reaction tube 205, and a stainless steel capping flange 227A having an O-ring or other sealing means are respectively provided.

Also, in the raising and lowering device 221, separate from the raising and lowering mechanism of the movable supporting means 222, winch or other raising and lowering mechanisms 221A and 221B for vertically moving a pair of movable arms 231 extending in the horizontal direction from the raising and lowering device 221 are provided. At the interior of these movable arms 231 is a purge gas supply route for gas supplied from a separately provided purge gas supply hose. Also, the ends of movable arms 231, as shown in FIG. 6, are secured to the upper end of an essentially tubular shaped quartz material cover 232.

Figure 6:
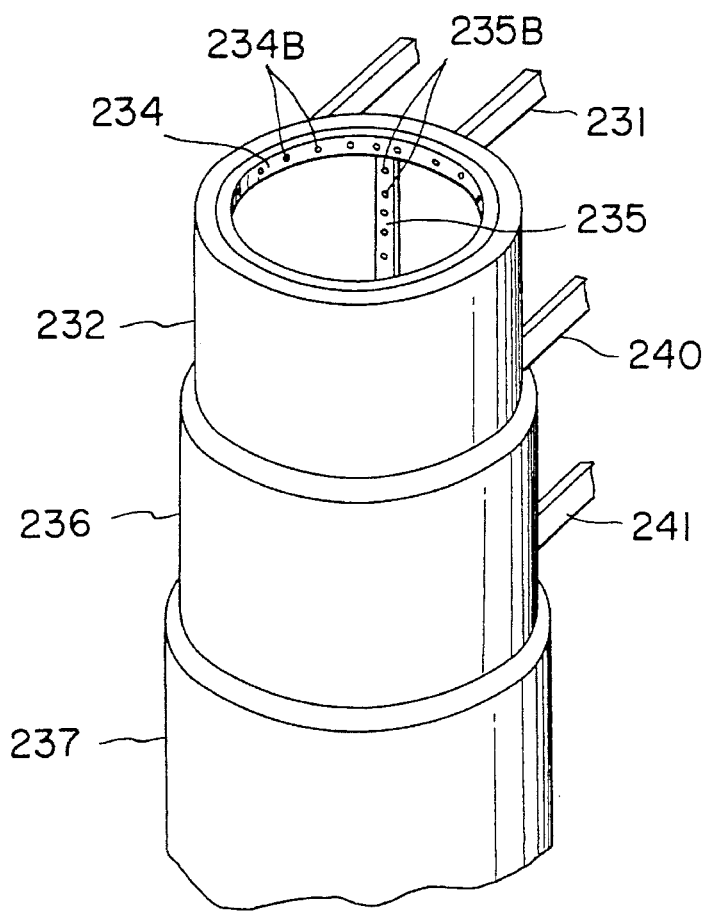
FIG. 6 is a perspective view of the covers shown in FIG. 5.

At the upper inner circumference of this cover 232, as shown in FIG. 6, is an annular shaped nozzle means 234 having a plurality of nozzle openings 234B arranged in an annular form. In the inner circumference vertical direction, a plate shaped nozzle means 235 having a plurality of nozzle openings 235B arranged at suitable locations in the vertical direction is provided. These nozzle openings 234B and 235B of the annular and plate shaped nozzle means 234 and 235 communicate with the gas supply route inside the movable arms 231.

At the outer circumference of the cover 232, a quartz material cover 236 is arranged so as to be freely slidable, in addition, in the same manner, quartz material covers 237, 238 and 239 having successively larger inner diameters are arranged concentrically so as to be freely slidable in sequence. Inward projecting rim shaped flanges are formed at the tops of these covers 236, 237, 238 and 239, while outwardly projecting rim shaped flanges are formed at the bottoms of the covers.

The covers 236, 237, 238 and 239 are respectively supported by slide arms 240, 241, 242 and 243 so as to allow free vertical sliding by the raising and lowering device 221. These slide arms 240, 241, 242 and 243 are respectively connected to the movable arms 231. When the movable arms 231 are raised by the raising and lowering mechanisms 221A and 221B to only the cover 236 height, the slide arm 240 rises. Then when the movable arms 231 are raised the cover 237 height, the slide arm 241 rises. The slide arms 242 and 243 also operate in the same manner.

As an example for realizing this type of construction, the relationship between only the movable arm 231 and slide arm 240 is described as follows.

It is adequate to connect a wire with length corresponding to the height of the cover 232 between the top and bottom of the movable arm 231 and slide arm 240. By this means, at the point where the movable arm 231 raises to the cover 232 height, the slide arm 240 is pulled and raised by the wire. The construction is not limited to this type, and a completely different independent drive system (e.g., hydraulic cylinder) can also be used for raising, lowering and control.

In the same manner as the movable arms 231, gas supply paths are also formed in the slide arms 240, 241, 242 and 243. These respectively communicate with the nozzle openings of the plate shaped nozzle means 244, 245, 246 and 247 provided in the vertical direction in the inner circumference walls of the covers 236, 237, 238 and 239.

The operation of a heat treatment apparatus in accordance with this second embodiment constructed in the above manner is described below with reference to an example of use for polysilicon film forming treatment of semiconductor wafer surfaces.

The treatment objects (semiconductor wafers W) are shifted from the wafer cassette to the boat 226 by a separately provided shifting device. FIG. 5 shows the state after the treatment objects have been shifted. In the boat 226, for example 100 treatment objects W are loaded at equal spacing in the horizontal direction. Next, power is supplied to the heater 206 to heat the interior of the reaction tube 205 to approximately 620 degrees C. Also, inert purge gas such as $N_2$ or Ar is supplied from the purge gas introducing tube 210 to set the process tube 205 interior to an inert atmosphere.

Figure 8:
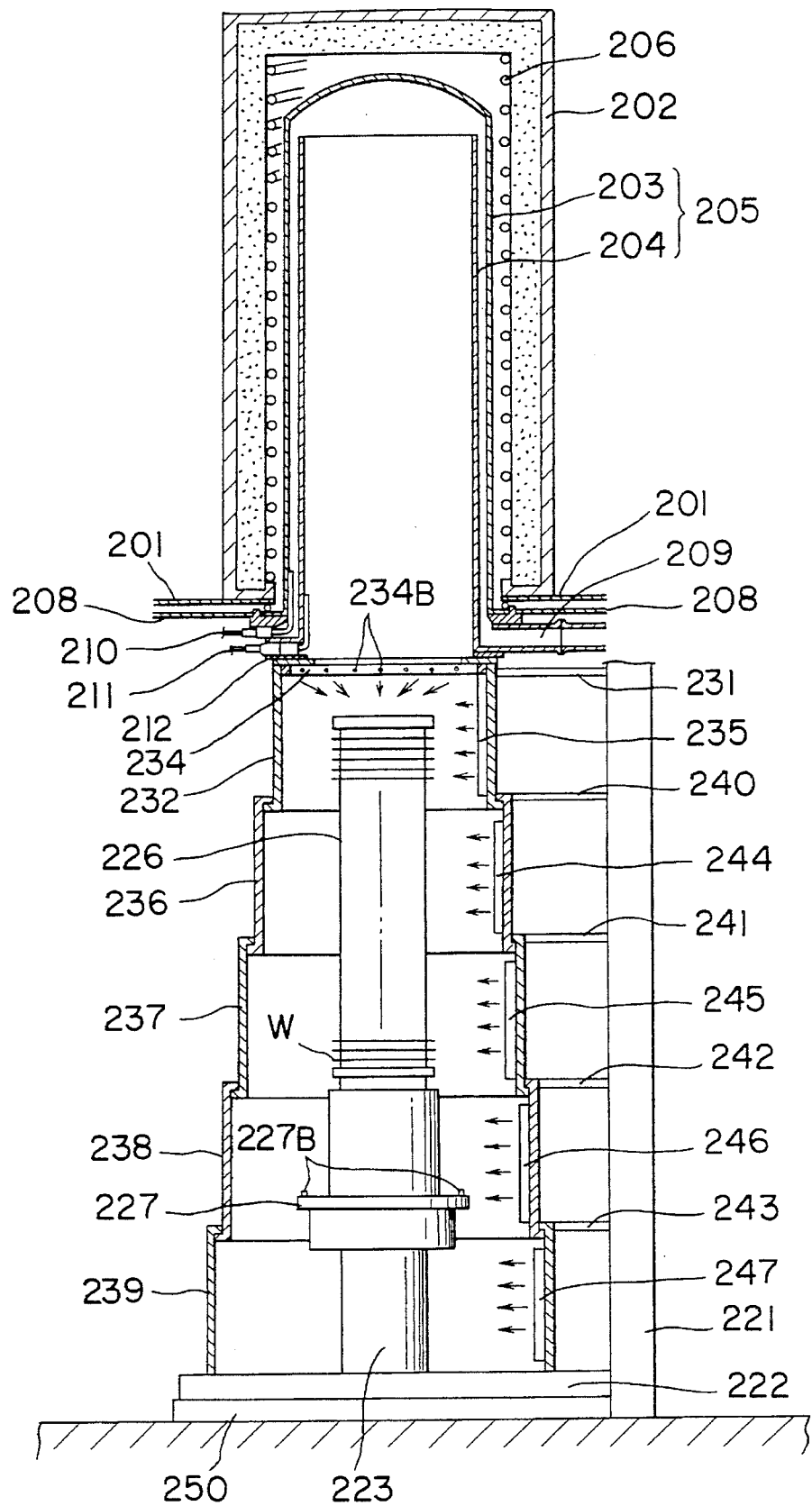
FIG. 8 is an overall vertical cross sectional view of the heat treatment apparatus of FIG. 5 in the state with all covers completely extended.

The movable arms 231 and slide arms 240, 241, 242 and 243 are then sequentially raised by raising and lowering mechanisms 221A and 221B. The covers 232, 236, 237, 238 and 239 are raised and when extended as shown in FIG. 8, the upper end of cover 232 tightly contacts the furnace opening flange 212. In this state, a vertical route is formed for passage of the boat 226 to the furnace opening. In other words, the furnace opening is extended to the lowest end of the cover 239.

After extending the covers 232, 236, 237, 238 and 239 in this manner, purge gas such as $N_2$ or Ar is supplied from annular shaped nozzle means 234 or plate shaped nozzle means 235, 244, 245, 246 and 247 into the covers 232, 236, 237, 238 and 239 via the gas supply routes formed by the slide arms 240, 241, 242 and 243. In this manner, not only the process tube 205, but the interiors of the covers 232, 236, 237, 238 and 239 as well are purged by $N_2$ or Ar gas. Also, in this period, generated dust or particles are exhausted to the exterior of the heat treatment apparatus.

Figure 9:
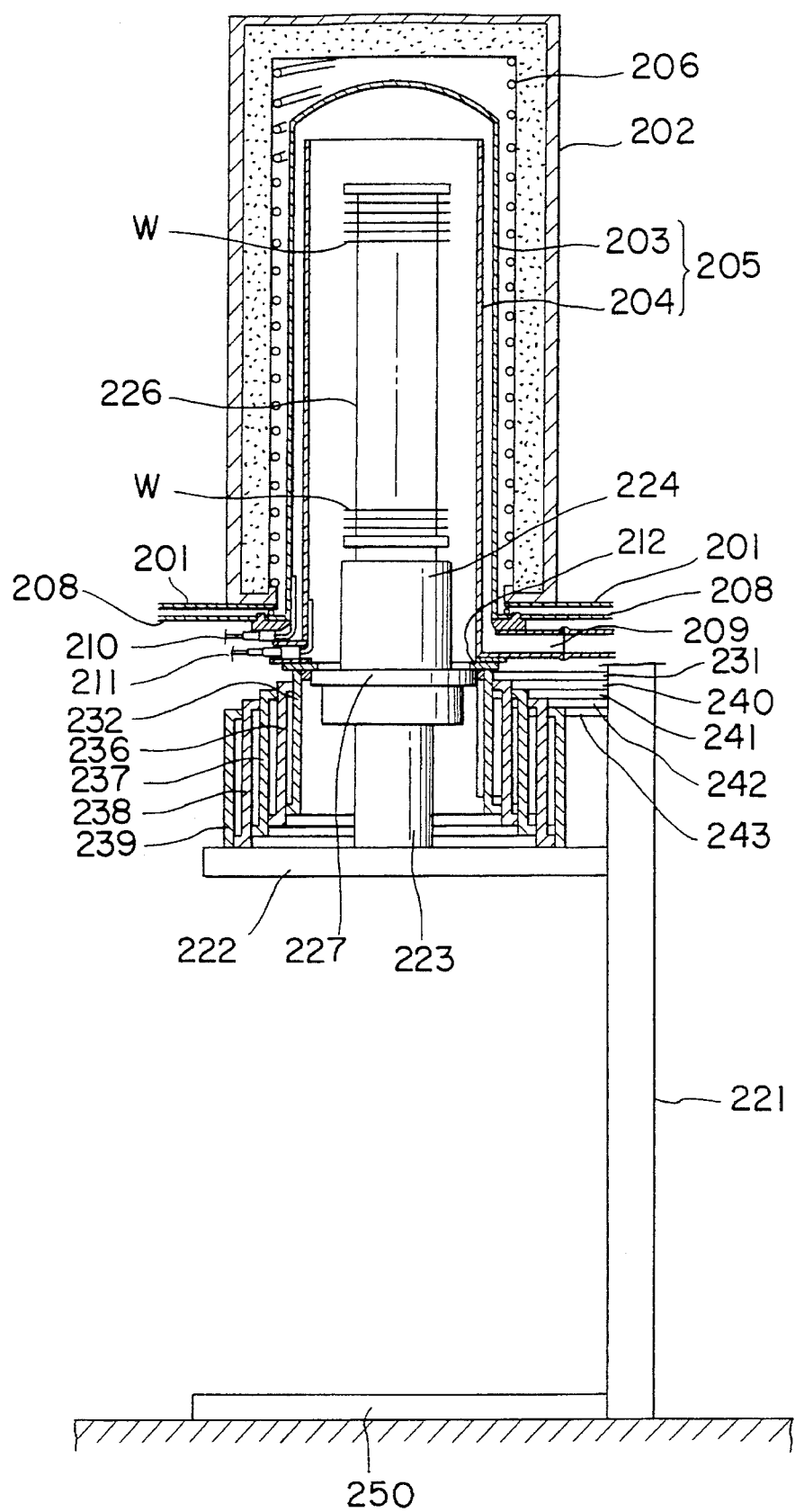
FIG. 9 is an overall vertical cross sectional view of the heat treatment apparatus of FIG. 5 in the state with the heat treatment boat loaded, the reaction tube sealed and the covers compressed in the upward direction.

The movable supporting means 222 is then raised by the raising and lowering device 221 and as the boat 226 is raised. The movable supporting means 222 sequentially raises the covers from the lowest end position cover 239. Therefore, as shown in FIG. 9, the covers 232, 236, 237, 238 and 239 are compressed, and the capping flange 227 at the temperature holding tube 224 base circumference edge tightly contacts the furnace opening flange 212 to hermetically seal the reaction tube 205 interior.

After hermetically sealing the interior of the process tube 205, the purge gas is exhausted from the process tube via the exhaust tube 209, and the internal pressure is reduced to 0.2 Torr. Reaction gas $SiH_4$ from the process gas introducing tube 211 is then supplied at 300 SCCM to perform polysilicon film formation treatment on the surfaces of the treatment objects W.

Following this type of film formation treatment, in order to shift to film formation treatment of the next treatment objects, the reaction gas in the reaction tube 205 is first purged with inert $N_2$ or Ar gas and the internal pressure is raised to normal pressure. Next, with the movable arms 231 in the fixed state, by lowering the movable supporting means 222, the covers 239, 238, 237, 236 and 232 are lowered in sequence. After again reaching the state shown in FIG. 8, the movable arms 231 are lowered and the covers 232, 236, 237, 238 and 239 are lowered and compressed to return the FIG. 5 state. Afterwards, it is adequate to exchange the treated objects W contained in the boat 226 with new treatment objects and again perform the same operation.

As clarified by the above operating description, in the second embodiment, prior to raising the boat 226, the vertical route is formed by the extended state (FIG. 8) of the covers 232, 236, 237, 238 and 239 from the movable supporting means 222 upper end face to the furnace opening flange 212, i.e., the furnace opening is extended downward. Since the boat 226 containing the treatment objects W is raised within this route, the risk of contamination from the boat of atmospheric air or dust into the process tube 205 is greatly reduced.

Moreover, in this vertical route, since purge gas is supplied in the route forming covers 232, 236, 237, 238 and 239 by annular shaped nozzle means 234 or plate shaped nozzle means 235, 244, 245, 246 and 247, as indicated in FIG. 8, incursion of atmospheric air or dust is greatly reduced. Also, since purge gas is supplied in the horizontal direction from the plate shaped nozzle means 235, 244, 245, 246 and 247, as shown in FIG. 8, the mutual top and bottom spaces between the treatment objects W loaded at equal spacing in the horizontal direction are well covered and even if particles are present in these areas, these are cleaned and exhausted to the heat treatment apparatus exterior. Consequently, when the boat 226 is transported into the process tube 205, incursion of atmospheric air or dust is greatly reduced.

Also, when the boat 226 is removed from the process tube 205 after film formation treatment, as the boat 226 is lowered, the covers 239, 238, 237, 236 and 232 are lowered and extended in sequence. Consequently, the influx of atmospheric air or dust due to internal and external pressure difference and thermal backflow is suppressed.

In this second embodiment, as shown in FIG. 9, when the boat 226 is raised and the movable supporting means 222 is stopped by the bottom of the cover 239, the movable supporting means 222 cannot be raised further. However, when constructing a vertical heat treatment furnace, considerable effort is applied to maintaining the vertical direction space. Consequently, it is desirable to suppress the overall apparatus height to the extent possible.

Figure 7:
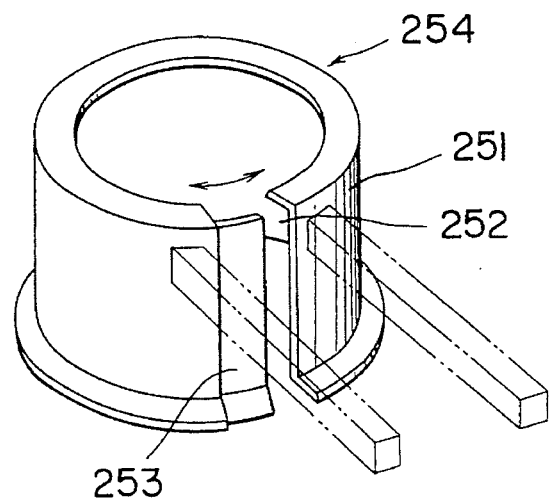
FIG. 7 is a perspective view of another embodiment of the covers shown in FIG. 5.

Therefore, in place of the covers 232, 236 to 239 used in the above description, as shown in FIG. 7, a cover 254 comprising a vertical cutout 252 can be provided in the cover structure 251 together with a freely closable shutter 253 freely sliding in the circumference direction in this cover 251.

By this arrangement, in the state as shown in FIG. 9 opening the shutter of each cover forms cutouts 252, and since the movable supporting means 222 can pass through the cutouts 252, the boat 226 can be raised further. In other words, by using this type of cover 254, as shown in FIG. 9, the vacuum CVD apparatus height (tubular furnace 202 height) can be reduced to the height of a single cover.

Also, in the second embodiment, flanges are formed at the top and bottom ends of the covers 232, 236, 237, 238 and 239. When the covers are extended, the flanges mutually contact and to some extent maintain the sealing of the vertical route formed by the covers. However, it is also acceptable not to use this type of connecting construction, but instead to form a slight gap between the covers in the extended state.

For example, by making the raising interval of each slide arm 240, 241, 242 and 243 coupled with the raising of the movable arms 231 successively slightly shorter, spaces can be produced between the flanges. By this type of construction, the covers 232, 236, 237, 238 and 239 do not mutually contact, and particles are not produced.

In this type of case, there is some loss of sealing quality of the vertical route formed by the covers. However, by providing a nozzle means at the upper end circumference of each cover, and emitting the purge gas in an annular pattern, the effect of these spaces can be compensated.

In the foregoing, an example of use as a vacuum CVD apparatus was described for the second embodiment. However, this is not a limitation and the present invention is also applicable to other types of systems including normal pressure CVD, oxidation, film formation and diffusion apparatus.

What is claimed is:

1. A heat treatment apparatus, comprising:

a treatment container including a top and a bottom;

a holding means for holding treatment objects in said treatment container, wherein treatment gas is supplied from said top toward said bottom of said treatment container for heat treating the treatment objects;

means at said top of said treatment container for defining a gas introducing hole, said gas introducing hole formed substantially in the center of said top;

a gas diffusion plate provided between said top of said treatment container and an upper face of said holding means so that a gas charging space is defined therebetween;

wherein a heat treatment space is defined beneath said gas diffusion plate; and said gas diffusion plate consisting of a plurality of flowholes formed in only a portion of said gas diffusion plate that corresponds to a space between the outer circumference of the treatment objects held in said holding means and the inner circumference of said treatment container, said flowholes being located at equal intervals in a circumferential direction within said portion of said plate.

2. (Amended) The heat treatment apparatus of claim 1 wherein said treatment container is constructed of an inner tube and an outer tube, concentrically arranged and mutually separated by an annular space, wherein the tops of said inner tube and said outer tube are sealed and the bottom ends of said inner tube and said outer tube respectively seal said annular space, the heat treatment apparatus further comprising:

a gas supply means for supplying treatment gas to the bottom end of said annular space; wherein the treatment gas is heated during an interval between when said gas is supplied from said supply means and when said gas reaches said introducing hole.

3. The heat treatment apparatus of claim 1 wherein a total of 10 to 40 flowholes, each of 3 mm diameter, are provided in said portion of said gas diffusion plate.

4. The heat treatment apparatus of claim 1 wherein the treatment gas emission rate from said flow holes is more than 17 m/minute.

5. The heat treatment apparatus of claim 1 wherein said treatment gas is water vapor.

6. The heat treatment apparatus of claim 1 wherein said holding means is a semiconductor wafer boat.

7. The heat treatment apparatus of claim 1 wherein an exhaust conduit is connected to the bottom of said treatment container, a branching tube is arranged in said exhaust conduit, and a gas pressure adjusting device including a movable valve which closes by its own weight is provided in said branching tube.

8. The heat treatment apparatus of claim 1 wherein an exhaust conduit is connected to the bottom of said treatment container, said heat treatment apparatus further comprising:

a branching tube arranged in said exhaust conduit;

a pressure sensor arranged in said branching tube for detecting exhaust gas pressure; and a pressure control means for controlling the pressure in said exhaust conduit, said control means including a motor driven in accordance with an output of said pressure sensor for controlling an opening degree of a valve in said exhaust conduit.

9. The heat treatment apparatus of claim 1 wherein the apparatus is an oxidation treatment apparatus.

10. The heat treatment apparatus of claim 1 wherein the apparatus is a CVD treatment apparatus.

11. The heat treatment apparatus of claim 1 wherein the apparatus is a diffusion treatment apparatus.

12. The heat treatment apparatus of claim 1 wherein the apparatus is a vertical heat treatment furnace.

* * * * *